United States Patent [19]

Magliocco et al.

[11] Patent Number: 4,809,221

[45] Date of Patent: Feb. 28, 1989

[54] TIMING SIGNAL GENERATOR

[75] Inventors: Paul D. Magliocco, Milpitas; Steven R. Bristow, San Jose, both of Calif.

[73] Assignee: Megatest Corporation, San Jose, Calif.

[21] Appl. No.: 186,331

[22] Filed: Apr. 26, 1988

Related U.S. Application Data

[62] Division of Ser. No. 8,212, Jan. 28, 1987, Pat. No. 4,779,221.

[51] Int. Cl.[4] ............................................. G06F 9/00
[52] U.S. Cl. .................................... 364/900; 377/44; 377/48; 377/37; 377/50; 377/52
[58] Field of Search ................... 364/200, 900; 377/44, 377/52, 39, 48, 50

[56] References Cited

U.S. PATENT DOCUMENTS 4,231,104 10/1980 St. Clair ............................ 364/900
4,482,983 11/1984 Slechta, Jr. ........................ 364/900

Primary Examiner—Gareth D. Shaw
Assistant Examiner—John G. Mills
Attorney, Agent, or Firm—Alan H. MacPherson; Paul J. Winters; Norman R. Klivans

[57] ABSTRACT

A unique timing system is provided which allows for a user to program timing events with variable periods and edges from a fixed frequency clock, and having resolution greater than that of the fixed reference frequency. Delay elements, which are inherently expensive, inaccurate, and require repeated calibration, are minimized.

21 Claims, 4 Drawing Sheets

4,809,221

TIMING SIGNAL GENERATOR

This application is a division of application Ser. No. 008,212, filed Jan. 28, 1987 now U.S. Pat. No. 4,779,221.

BACKGROUND OF THE INVENTION

This invention pertains to timing signal generation, particularly suitable for use in a computerized test system such as that used for testing integrated circuits.

Means for testing integrated circuits are well known in the art. Modern systems include the use of a digital computer which is programmed to generate specific timing signals for application to a device under test (DUT), and appropriate supply, ground, and other voltages required to simulate the actual operating environment of the DUT. As integrated circuit devices grow larger, the need for more accurate, high speed, inexpensive, and repeatable testing techniques, including means for generating the appropriate timing signals, are required. However, in order to obtain high speed, accurate, and repeatable timing signals, techniques have been employed which become increasingly expensive. Furthermore, many of these techniques, even though expensive, are not really as accurate or repeatable as desired.

One such prior art technique for generating timing signals is described in U.S. Pat. No. 4,231,104 issued Oct. 28, 1982, St. Clair. St. Clair provides that an oscillator, such as a crystal oscillator, is used to provide a clock signal. This clock signal is applied to a period generator circuit, which allows a period of desired length to be generated from the crystal oscillator. St. Clair utilizes a counter to count an integral number of clocks from the crystal oscillator and a delay line to interpolate between clock cycles in order that the period generated need not have a period equal to an integral number of clock cycles of the crystal oscillator. Furthermore, St. Clair, due to the manner in which he generates his timing signal edges, requires the period generated to provide two output signals: $T_{syn}$, which is a delayed version of the crystal oscillator clock signal, and $T_{out}$, the actual period signal. St. Clair requires the use of a delay line in order to provide these signals $T_{syn}$ and $T_{out}$ so that they are interpolated and thus not necessarily aligned with the crystal oscillator clock edge. Such delay lines typically comprise a rather long trace on a printed circuit board, thus requiring a rather large area on the printed circuit board and thus being expensive. Other types of delay lines which can be used are lumped inductor capacitor ladders or networks, which again are expensive. Furthermore, regardless of the type of delay line used, the delay line circuit must be carefully calibrated, thereby requiring additional calibration circuitry which is expensive and in itself difficult to maintain. Furthermore, even once a delay line circuit is calibrated, it is still subject to errors which are dependent on duty cycle and which cannot be removed by further calibration. The delay line circuit can easily drift out of calibration requiring extensive maintenance of the circuit for recalibration, and errors may be induced due to "jitter" caused by attenuation of the timing signal with an attendant alteration of the rise and fall times, and cross talk between the timing signal passing through the delay line and surrounding signals in the system. Yet another problem with prior art systems is their need to "broadcast" variable length $T_{syn}$ signal to many locations in a typical, large system, with inherent degradation in timing occurring due to transmission line effects, and variations among the several transmission lines used for "broadcasting" to various locations within the system.

St. Clair also provides a waveform generator which receives as input signals the $T_{syn}$ and $T_{out}$ signals from the period generator. The waveform generator of St. Clair FIG. 2 includes two edge generator circuits and a wave formatter (60). Each of St. Clair's edge generators includes memory which defines the placement of the edge within a period based on coincidence with a counter contained within the waveform generator. Furthermore, for each edge generator St. Clair provides an additional delay line in order to place the edge at a point which is interpolated between points provided by the period generator. As previously mentioned, these delay line circuits have severe disadvantages. Furthermore, in St. Clair's structure, the delay lines contained within the waveform generator have the potential of delaying the signal up to two times the period of the crystal oscillator. This introduces additional error.

An additional disadvantage to St. Clair's waveform generator is the fact that each edge generator within the waveform generator can provide only a single edge during a given period.

In addition, by the use of the various delay lines in St. Clair, timing signals within the circuit are not synchronized with the crystal oscillator, thereby making design, calibration, and debugging of such a timing system quite complex and frustrating.

SUMMARY

In accordance with the teachings of this invention, a unique timing system is provided which allows for a user to program timing events with variable periods and edges from a fixed frequency clock, and having resolution greater than that of the fixed reference frequency. In accordance with the teachings of this invention, delay elements, which are inherently expensive, inaccurate, and require repeated calibration, are minimized.

DETAILED DESCRIPTION

Figure 1:
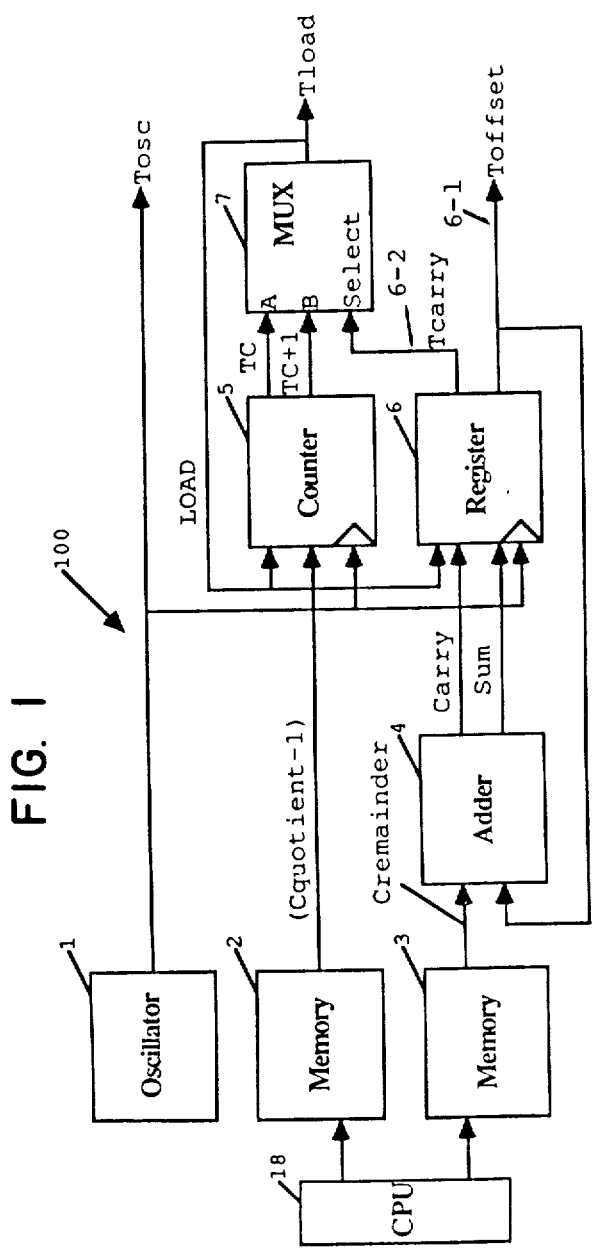
FIG. 1 is a block diagram of one embodiment of a period generator constructed in accordance with the teachings of this invention.

FIG. 1 is a block diagram of one embodiment of a period generator constructed in accordance with the teachings of this invention. Although we refer to the structure of FIG. 1 as a "period generator", it will be readily appreciated by those of ordinary skill in the art in light of the teachings of this invention that the period generator of FIG. 1, unlike prior art period generators, does not provide output signals which provide an actual period, but rather provide digital information which define the period. This digital information is used by the edge generator of FIG. 2 (described later) in order to provide the resultant output signals from the edge generator of FIG. 2.

Referring to FIG. 1, oscillator 1 is any suitable oscillator, such as a crystal oscillator. For the purpose of this description, certain time periods will be described, although it is to be understood that the structure of this invention can be implemented using any desired timing periods. For example, oscillator 1 is a crystal oscillator providing a very stable 16 nanosecond period, as is well known in the art. Period generator 100 also includes CPU 18 which serves to load memories 2 and 3 with appropriate information defining the period desired to be generated. In order to store appropriate data in memories 2 and 3, CPU 18 divides the desired period by the period of oscillator 1 and determines a C quotient which is the integral number of oscillator 1 clock periods which will fit in the desired period, and the C remainder, which is the interpolation required between clock cycles of oscillator 1. The C quotient is stored in memory 2, and the C remainder is stored in memory 3 which are, for example, emitter coupled logic RAMs. In essence, the actual number stored in memory 2 is a number which causes counter 5 to count C quotient clock ticks per period.

Counter 5 includes an input lead which receives the oscillator signal from oscillator 1. Counter 5 also includes a bus for receiving the number stored in memory 2, and a load input lead which causes counter 5 to load the data provided by memory 2 upon receipt of a $T_{load}$ signal which is generated when counter 5 has counted C quotient clock signals during this period. Counter 5 provides two output signals, a terminal count signal TC and a terminal count +1 signal TC+1. The TC signal goes active when counter 5 has received C quotient clock signals from oscillator 1, and the TC+1 output signal goes active when counter 5 has received (C quotient +1) clock signals from oscillator 1 following the most recent $T_{load}$ signal. It is necessary to provide both output signals TC and TC+1, with one of the two output signals chosen as a function of C remainder, as described below.

Adder 4 serves to provide the summation of C remainder values required to provide proper interpolation from period to period. For example, for an unchanging period, if C remainder is 2 nanoseconds, during the first period the interpolation must be 2 nanoseconds, during the second period, it must be 4 nanoseconds, during the third period it must be 6 nanoseconds, etc. until the interpolation becomes equal to or greater than the period of oscillator 1, in the example of FIG. 3, 16 nanoseconds. In this event, the $T_{carry}$ signal becomes active, causing multiplexer 7 to select the TC+1 output signal from counter 5 as the $T_{load}$ signal. For an embodiment where the period of oscillator 1 is 16 nanoseconds, and the desired resolution of the period is 1 nanosecond, adder 4 is a 4-bit adder and C remainder is a 4-bit number. This increases by 1 bit for each doubling of the period of oscillator 1, or halving of the resolution of the period. Adder 4 provides a carry and a sum output signal to register 6. Register 6 stores the sum received from adder 4 which indicates the interpolation factor required for this period. This interpolation factor is provided on bus 6—1 as data word T-offset. The $T_{carry}$ signal is also stored in register 6 and provided on output lead 6—2 to the select input lead of multiplexer 7, which causes multiplexer 7 to select either the TC or TC+1 signal from counter 5, as required. The $T_{offset}$ data is also applied to one input lead of adder 4, causing adder 4 to add the T-offset value with the C remainder value to provide a new carry and sum result for the next period.

Thus, period generator 100 provides output signals $T_{osc}$, the clock signal from oscillator 1, and $T_{load}$, a signal which restarts the edge generator counter for each period, although not necessarily at the precise beginning of that period, as is more fully described below with regard to the edge generator of FIG. 2. The relationship between the $T_{load}$ signal and when a new period starts is defined by the $T_{offset}$ data. In accordance with the teachings of this invention, a fixed frequency clock and a digital data word are used to "broadcast" period and length timing reference information to a plurality of locations, while avoiding the degradation in the clock signal for changing period length, since transmission line errors for fixed frequency clock signals are easily compensated, as is well known in the art.

In one embodiment of this invention, C quotient is the actual quotient as determined by the CPU. In this event, counter 5 counts from 1 to C quotient in response to the output signal from oscillator 1. The TC signal goes active when counter 5 reaches the value of C quotient, and the TC+1 signal goes active when counter 5 reaches C quotient +1. In an alternative embodiment of this invention, memory 2 stores C quotient −1, and counter 5, following each load signal, decrements from C quotient −1 to 0. In this event, output signal TC goes active when counter 5 reaches 0, and TC+1 signal goes active when counter 5 reaches 1 count beyond 0, i.e. rolls over to all ones. This is a particularly attractive approach, since it is quite easy to detect a binary number which consists of either all zeros (TC active) or all ones (TC+1 active).

Figure 2:
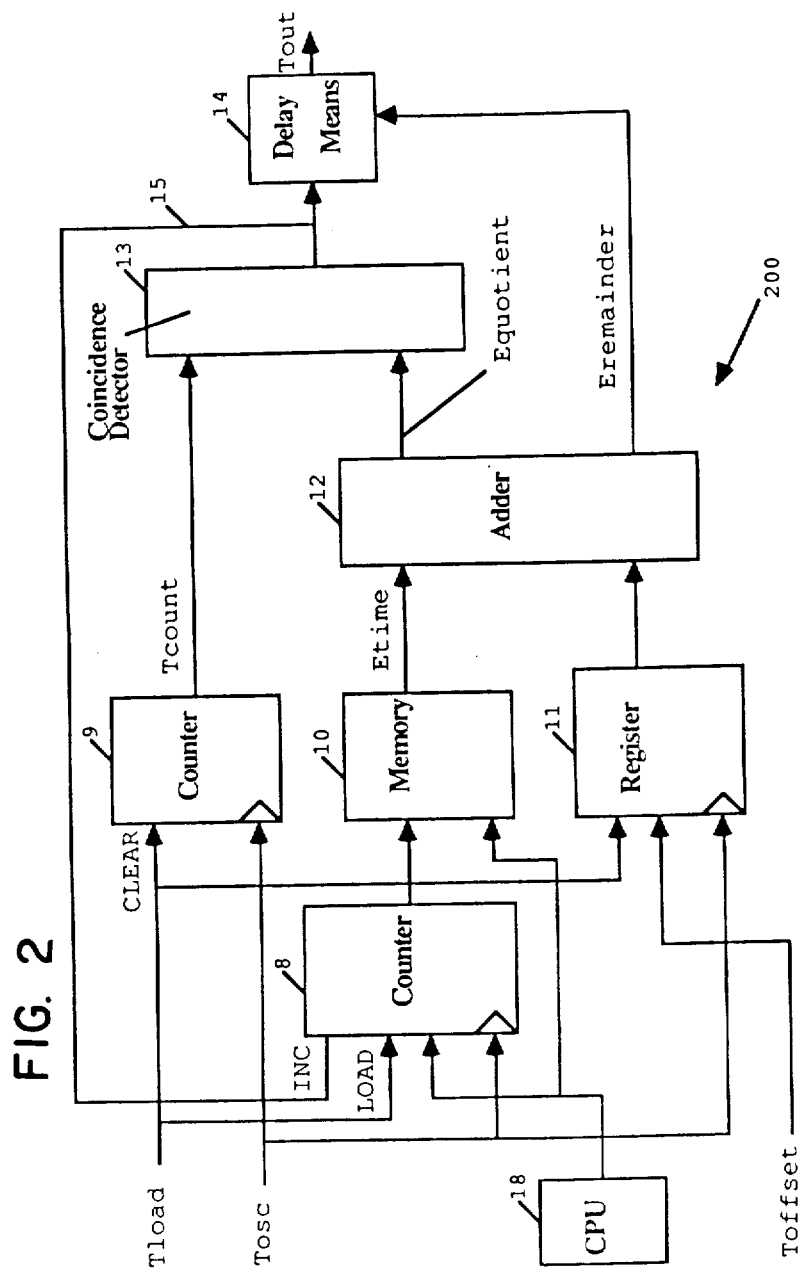
FIG. 2 is a block diagram of one embodiment of an edge generator constructed in accordance with the teachings of this invention.

FIG. 2 depicts one embodiment of an edge generator constructed in accordance with the teachings of this invention. As will become apparent to those of ordinary skill in the art from the following discussion, edge generator 2 is capable of providing a plurality of edges during a signal period, utilizing a single hardware circuit and a single delay line. Memory 10 is loaded by CPU 18 prior to testing of a DUT with values calculated assuming $T_{offset}$ is equal to zero. Edge generator 200 serves to adjust the placement of edges when $T_{offset}$ is not equal to zero. Memory 10 can include a plurality of data words defining a plurality of edges within a period. Also, memory 10 can include a plurality of such sets of data in order to have readily available such a plurality of edge definitions for a plurality of different period types. Counter 8 serves to address memory 10 to select the desired data word from memory 10. Counter 8 receives from CPU 18 the base address (i.e. the first address within a set of addresses). Alternatively, counter 8 receives this information from a high speed pattern generator, well known in the art. Counter 8 also receives the $T_{osc}$ signal which allows counter 8, when enabled by active LOAD or INC signals, to change its output state. When the LOAD signal is active, indicating a new period, new data from CPU 18 (alternatively a pattern generator, not shown) is loaded into counter 8 in order to access a new page of memory 10. Similarly, when the INC signal is active, counter 8 increments its count to access the next word of the selected page within memory 10, causing memory 10 to provide a data output word defining the next edge required to be generated in that period.

The data output word from memory 10 can specify that an edge is to be generated within an integral number of $T_{osc}$ cycles from the $T_{load}$ signal, and an interpolation factor which allows the edge to be generated between two adjacent $T_{osc}$ signals. Furthermore, since $T_{load}$ is in fact offset from the period beginning by $T_{offset}$, the $E_{time}$ data signal from memory 10 and the $T_{offset}$ value received from period generator 100 of FIG. 1 are added by adder 12 to provide an output signal $E_{quotient}$ and $E_{remainder}$ which defines precisely where the edge is to be placed with respect to $T_{osc}$ output signal which is enabled by $T_{load}$. To affect this, register 11 stores $T_{offset}$ in response to the $T_{load}$ signal when clocked by the $T_{osc}$ signal, in order that the $T_{offset}$ value will be readily available to adder 12. The most significant bits from adder 12 provide the $E_{quotient}$ value from adder 12 and the least significant bits provide the $E_{remainder}$ value from adder 12. In the example where oscillator 1 has a 16 nanosecond period and desired edge placement resolution is 1 nanosecond, $E_{quotient}$ is determined by the longest period desired to be generated and $E_{remainder}$ is 4 bits long. Thus, $E_{quotient}$ defines the number of $T_{osc}$ signals which must be counted prior to generation of the edge, and $E_{remainder}$ defines the amount of delay which must be provided by delay line 14 prior to generation of the edge. Counter 9 counts $T_{osc}$ signals following its clear by a $T_{load}$ signal. Counter 9 provides a $T_{count}$ output signal applied to coincidence detector 13. Coincidence detector 13 provides an output pulse to delay line 14 when T count equals $E_{quotient}$. The amount that this pulse is delayed by delay line 14 is determined by the value of $E_{remainder}$. This provides the desired $T_{out}$ signal which is, for example, applied to a wave formatter (not shown) in order to produce the desired wave form. Such wave formatters are well known in the art and thus will not be described here. The output pulse from coincidence detector 13 is also applied via lead 15 to the INC input lead of counter 8, enabling counter 8 to increment and address the next word of the selected page of memory 10, as previously described.

Figure 3:
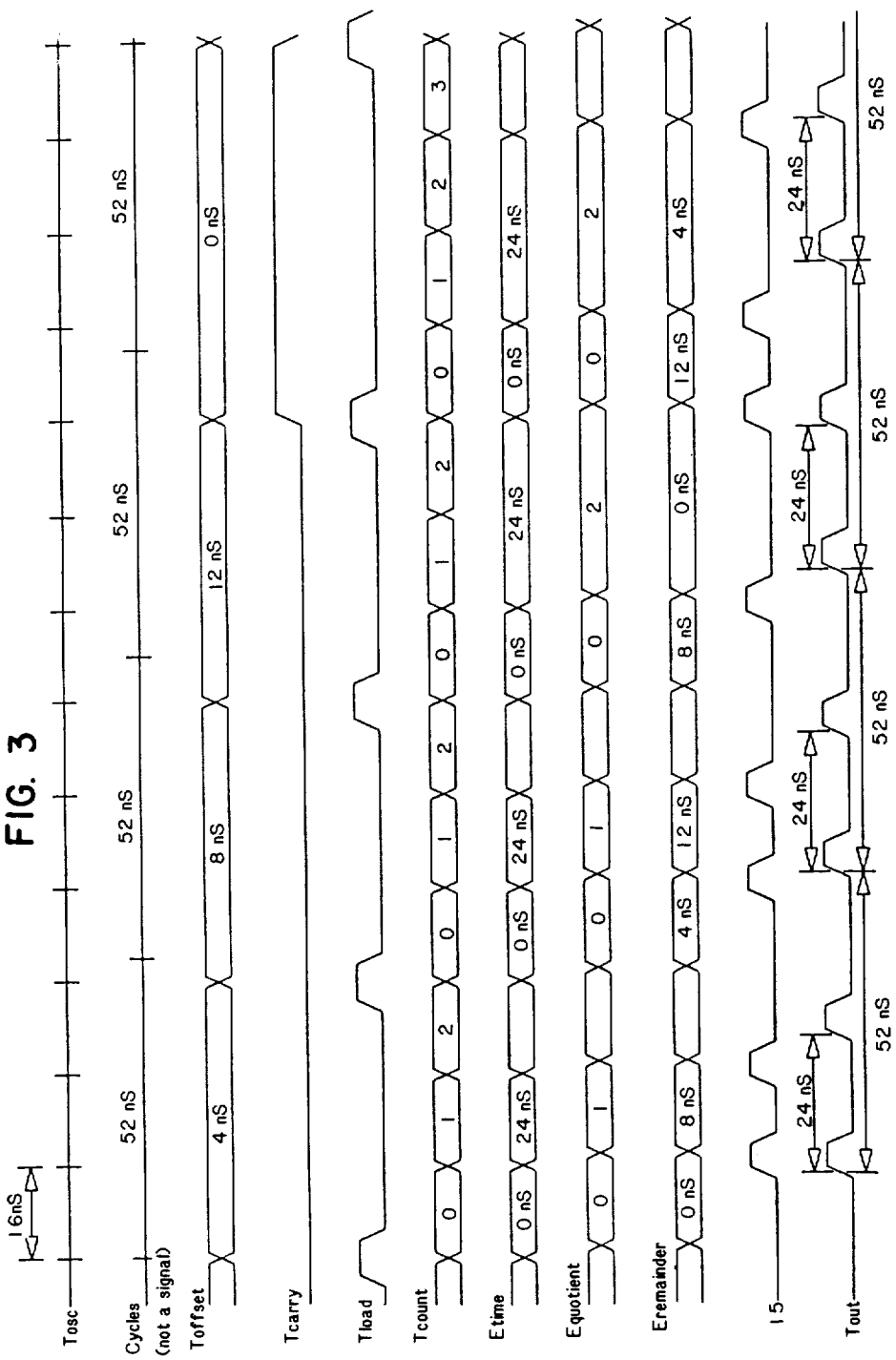
FIG. 3 is a timing diagram depicting one embodiment of the operation of the structures of FIG. 1 and FIG. 2.

FIG. 3 depicts various timing signals for the embodiments of FIGS. 1 and 2, when $T_{osc}$ is 16 nsec, the period length is 52 nsec and $T_{out}$ pulses are generated at 0 nsec and 24 nsec from a period start. Of importance, a cycle marker is shown in FIG. 3 for reference only, and does not actually appear as an output signal anywhere in the circuit.

Figure 4:
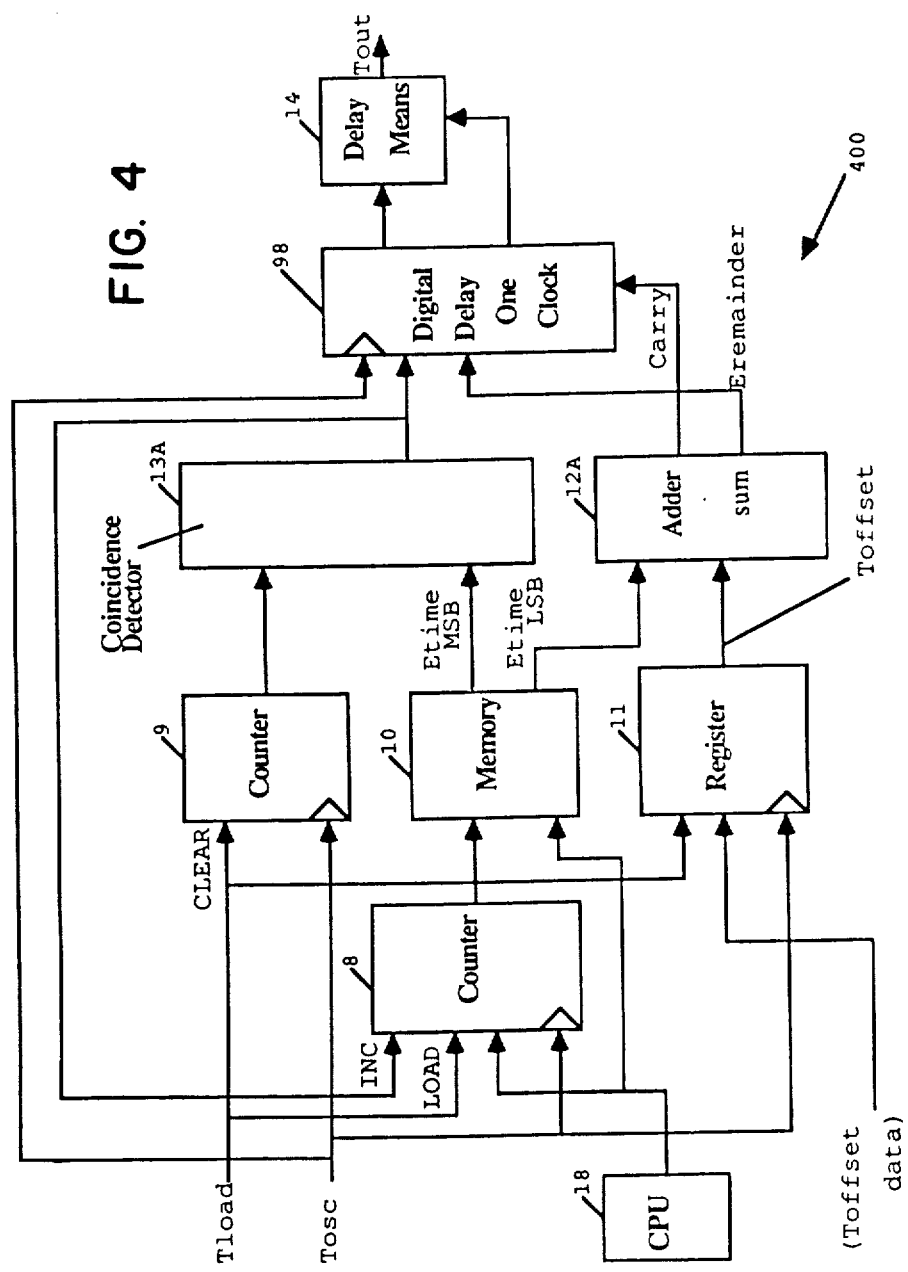
FIG. 4 is a block diagram of another embodiment of an edge generator constructed in accordance with the teachings of this invention.

FIG. 4 depicts another embodiment of an edge generator 400 constructed in accordance with the teachings of this invention. The structure of FIG. 4 serves to minimize the width of the adder used, thereby simplifying the circuit and enhancing the speed. The structure of FIG. 4 separates the output bits from memory 10 to provide $E_{time}$ MSB and $E_{time}$ LSB. The $E_{time}$ LSB is the interpolation factor stored in memory 10 as loaded by CPU 18. CPU 18 computes $E_{time}$ LSB and $E_{time}$ MSB assuming $T_{offset}$ is zero. Edge generator 400 serves to adjust the placement of the edges when $T_{offset}$ is not equal to zero. $E_{time}$ LSB and $T_{offset}$ are added by adder 12a which provides an $E_{remainder}$ output signal and a carry signal. The $E_{time}$ MSB is applied to coincidence detector 13a which operates to detect when the number of $T_{osc}$ clock signals counted by counter 9 is equal to $E_{time}$ MSB. At this time, coincidence detector 13a provides an output signal indicating that an edge is to be generated. The carry signal from adder 12a serves to indicate when the output signal from coincidence detector 13a should be delayed a single $T_{osc}$ count. When required, this single count delay is provided by digital delay circuit 98 which is well known in the art, and in one embodiment comprises a one bit shift register and a multiplexer which selects either the input signal or the output signal from the one bit shift register. Thus, digital and delay circuit 98 delays the output signal from coincidence detector 13a by a single $T_{osc}$ count, and provides the E remainder signal to delay line 14 following this digital delay.

The specific embodiments of this invention described in this specification are intended to serve by way of example and are not a limitation on the scope of my invention. Numerous other embodiments of this invention will become apparent to those of ordinary skill in the art in light of the teachings of this specification.

I claim:

1. A timing system comprising:
    means for receiving a fixed frequency clock signal;
    a first input terminal for receiving a LOAD signal which defines the start of a new period synchronized to the closest previous clock signal;
    a second input terminal for receiving an offset value which defines the relationship between said LOAD signal and the actual start of said period to be generated;
    a memory for storing a value which defines when an edge is to be generated with respect to the start of a period;
    a counter for counting clock signals following receipt of said LOAD signal and providing an output signal indicating the number of said clock signals received since the start of the current period defined by said LOAD signal;
    an adder for adding said value stored in said memory and said offset value and providing a quotient output value which defines the integral number of said clock signals after which said edge is to occur, and a remainder value which defines the fraction of a period of said clock signal after said quotient value when said edge is to occur;
    a coincidence detector for providing an output signal when said output signal from said counter is equal to said quotient value; and
    a programmable delay means having an input lead for receiving said output signal of said coincidence detector and having an output lead for providing a delayed version of said output signal of said coincidence detector, said programmable delay means having its delay programmed by said remainder signal.

2. The structure of claim 1 wherein said memory is loaded from a CPU.

3. The structure of claim 1 wherein memory contains a plurality of values, each said value defining a different edge to be generated within a single period.

4. The structure of claim 1 wherein addressing of said memory is controlled by a counter.

5. The structure of claim 3 wherein addressing said memory is controlled by a CPU.

6. The structure of claim 3 wherein addressing said memory is controlled by a high-speed pattern generator.

7. The structure as in claim 1 wherein said LOAD signal is synchronous with said clock signal.

8. The structure as in claim 1 wherein operation, other than of said programmable delay means, is synchronous with said clock signal.

9. The structure as in claim 1 wherein the total necessary delay required to be provided by said programmable delay means is less than or equal to the period of said fixed frequency clock signal.

10. A timing system comprising:

means for receiving a fixed frequency clock signal;

a first input terminal for receiving a LOAD signal which defines the start of a new period synchronized to the closest previous clock signal;

a second input terminal for receiving an offset value which defines the relationship between said LOAD signal and the actual start of said period to be generated;

a first memory for storing a first value which defines the number of clock signals after the start of a period when an edge is to be generated; and a second memory for storing a second value which defines the fraction of a period of said clock signal needed to be added to said number of clock signals in order to provide said edge to be generated;

a counter for counting clock signals following receipt of said LOAD signal and providing an output signal indicating the number of said clock signals received since the start of the current period defined by said LOAD signal;

an adder for adding said value stored in said second memory and said offset value and providing a first output value which defines the integral number of said clock signals after which said edge is to occur, and a second output value which defines the fraction of a period of said clock signal after said first output value when said edge is to occur;

a coincidence detector for providing an output signal when said output signal from said counter is equal to said first; and a programmable delay means having an input lead for receiving said output signal of said coincidence detector and having an output lead for providing a delayed version of said output signal of said coincidence detector, said programmable delay means having its delay programmed by said first and second output signals of said adder.

11. The structure of claim 10 wherein said programmable delay means includes a first delay means capable of providing a delay equal to the period of said clock signal and a second delay means capable of providing a delay programmed by said second output value of said adder.

12. The structure of claim 11 wherein said first delay means is a digital delay means.

13. The structure of claim 10 wherein said first and second memories are loaded from a CPU.

14. The structure of claim 10 wherein said first and second memories each contain a plurality of values, each said value defining a different edge to be generated during a single period.

15. The structure of claim 10 wherein said first and second memories are addressed by a counter.

16. The structure of claim 14 wherein said first and second memories are addressed by a CPU.

17. The structure of claim 15 wherein said first and second memories are addressed by a high-speed pattern generator.

18. The structure as in claim 10 wherein said first output signal of said adder is a sum and said second output signal of said adder is a carry.

19. The structure as in claim 10 wherein said LOAD signal is synchronous with said clock signal.

20. The structure as in claim 10 wherein operation is synchronous with said clock signal.

21. The structure as in claim 10 wherein the total necessary delay required to be provided by said programmable delay means is less than or equal to the period of said fixed frequency clock signal.

* * * * *